US009595526B2

(12) United States Patent
Zerbe et al.

(10) Patent No.: US 9,595,526 B2
(45) Date of Patent: Mar. 14, 2017

(54) MULTI-DIE FINE GRAIN INTEGRATED VOLTAGE REGULATION

(71) Applicant: Apple Inc., Cupertino, CA (US)

(72) Inventors: Jared L. Zerbe, Woodside, CA (US); Emerson S. Fang, Fremont, CA (US); Jun Zhai, San Jose, CA (US); Shawn Searles, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/077,512

(22) Filed: Nov. 12, 2013

(65) Prior Publication Data
US 2015/0041955 A1 Feb. 12, 2015

Related U.S. Application Data

(60) Provisional application No. 61/864,014, filed on Aug. 9, 2013.

(51) Int. Cl.
*H01L 21/02* (2006.01)
*H01L 27/10* (2006.01)
(Continued)

(52) U.S. Cl.
CPC .......... *H01L 27/101* (2013.01); *H01G 4/228* (2013.01); *H01L 23/13* (2013.01); *H01L 23/481* (2013.01);
(Continued)

(58) Field of Classification Search
CPC ..... H01L 23/642; H01L 23/481; H01L 25/16; H01L 25/18; H01L 27/101; H01G 4/28
(Continued)

(56) References Cited

U.S. PATENT DOCUMENTS 4,080,590 A * 3/1978 Pricer .......................... 365/149
6,335,566 B1 * 1/2002 Hirashima et al. ........... 257/686
(Continued)

FOREIGN PATENT DOCUMENTS

WO 2006114772 2/2006

OTHER PUBLICATIONS

ISSCC, "A Fully-Integrated 3-Level DC/DC Converter for Nanosecond-Scale DVS with Fast Shunt Regulation", Wonyoung Kim, et al., Feb. 22, 2011, pp. 268-270.
(Continued)

*Primary Examiner* — A. Sefer
(74) *Attorney, Agent, or Firm* — Meyertons, Hood, Kivlin, Kowert & Goetzel, P.C.; Gareth M. Sampson; Lawrence J. Merkel

(57) ABSTRACT

A semiconductor device package is described that includes a power consuming device (such as an SOC device). The power consuming device may include one or more current consuming elements. A passive device may be coupled to the power consuming device. The passive device may include a plurality of passive elements formed on a semiconductor substrate. The passive elements may be arranged in an array of structures on the semiconductor substrate. The power consuming device and the passive device may be coupled using one or more terminals. The passive device and power consuming device coupling may be configured in such a way that the power consuming device determines functionally the way the passive device elements will be used.

21 Claims, 5 Drawing Sheets

(51) Int. Cl.
| | |
|---|---|
| *H01L 23/48* | (2006.01) |
| *H01L 23/13* | (2006.01) |
| *H01L 23/64* | (2006.01) |
| *H01L 25/16* | (2006.01) |
| *H01L 25/18* | (2006.01) |
| *H01G 4/228* | (2006.01) |
| *H01L 49/02* | (2006.01) |
| *H01L 23/00* | (2006.01) |
| *H01L 25/065* | (2006.01) |
| *H01L 25/10* | (2006.01) |
| *H01L 23/498* | (2006.01) |
| *H01L 23/50* | (2006.01) |

(52) U.S. Cl.
CPC ............ *H01L 23/642* (2013.01); *H01L 25/16* (2013.01); *H01L 25/18* (2013.01); *H01L 28/40* (2013.01); *H01L 23/49816* (2013.01); *H01L 23/49827* (2013.01); *H01L 23/50* (2013.01); *H01L 24/14* (2013.01); *H01L 24/16* (2013.01); *H01L 24/32* (2013.01); *H01L 24/48* (2013.01); *H01L 24/73* (2013.01); *H01L 25/0657* (2013.01); *H01L 25/105* (2013.01); *H01L 2224/0401* (2013.01); *H01L 2224/13025* (2013.01); *H01L 2224/1403* (2013.01); *H01L 2224/14181* (2013.01); *H01L 2224/16145* (2013.01); *H01L 2224/16227* (2013.01); *H01L 2224/16265* (2013.01); *H01L 2224/32225* (2013.01); *H01L 2224/48227* (2013.01); *H01L 2224/73265* (2013.01); *H01L 2225/06513* (2013.01); *H01L 2225/06517* (2013.01); *H01L 2225/1023* (2013.01); *H01L 2225/1058* (2013.01); *H01L 2225/1088* (2013.01); *H01L 2924/1033* (2013.01); *H01L 2924/12042* (2013.01); *H01L 2924/1427* (2013.01); *H01L 2924/1432* (2013.01); *H01L 2924/1434* (2013.01); *H01L 2924/1436* (2013.01); *H01L 2924/157* (2013.01); *H01L 2924/15153* (2013.01); *H01L 2924/15159* (2013.01); *H01L 2924/15174* (2013.01); *H01L 2924/15311* (2013.01); *H01L 2924/15331* (2013.01); *H01L 2924/19011* (2013.01); *H01L 2924/19041* (2013.01); *H01L 2924/19042* (2013.01); *H01L 2924/19103* (2013.01); *H01L 2924/19104* (2013.01)

(58) Field of Classification Search
USPC .......................................................... 257/532
See application file for complete search history.

(56) References Cited

U.S. PATENT DOCUMENTS

| | | | |
|---|---|---|---|
| 7,952,160 | B2 | 5/2011 | Triantafillou et al. |
| 8,341,434 | B2 | 12/2012 | Gervais et al. |
| 8,809,951 | B2 | 8/2014 | Lin et al. |
| 2005/0213267 | A1* | 9/2005 | Azrai et al. ..................... 361/15 |
| 2007/0134925 | A1* | 6/2007 | Eilert .................. H01L 21/4857 438/700 |
| 2008/0100989 | A1* | 5/2008 | Chen .................. H01L 23/5223 361/328 |
| 2008/0128854 | A1* | 6/2008 | Augustine ................ H01G 4/30 257/532 |
| 2008/0157343 | A1 | 7/2008 | Dattaguru et al. |
| 2008/0185614 | A1* | 8/2008 | Gamand et al. .............. 257/203 |
| 2010/0265682 | A1* | 10/2010 | Martinez et al. ............. 361/782 |
| 2011/0069425 | A1* | 3/2011 | Hsu ........................ H01L 22/22 361/330 |
| 2011/0108948 | A1* | 5/2011 | Kim et al. ..................... 257/532 |
| 2011/0294265 | A1* | 12/2011 | Shioga et al. ................ 438/118 |
| 2011/0317387 | A1 | 12/2011 | Pan et al. |
| 2012/0037969 | A1* | 2/2012 | Sanders et al. ............... 257/296 |
| 2012/0112352 | A1 | 5/2012 | Chi et al. |
| 2012/0289021 | A1* | 11/2012 | Ching et al. .................. 438/386 |
| 2013/0295727 | A1* | 11/2013 | Hsu et al. ..................... 438/130 |
| 2014/0138845 | A1* | 5/2014 | Kulkarni et al. ............. 257/774 |
| 2014/0252547 | A1 | 9/2014 | Chen et al. |

OTHER PUBLICATIONS

Proceedings of the IEEE, "Practical Strategies for Power-Efficient Computing Technologies", Leland Chang, et al., Feb. 2, 2010, pp. 215-236.
"A Fully-Integrated Switched-Capacitor 2:1 Voltage Converter with Regulation Capability and 90% Efficiency at 2.3A/mm2" Leland Chang, et al., 2010, pp. 55-56.
Invitation to Pay Additional Fees from PCT/US2014/048603, mailed Nov. 17, 2014, Apple Inc., pp. 1-8.
International Search Report and Written Opinion from PCT/US2014/048603, issued Feb. 12, 2015, Apple Inc., pp. 1-28.
U.S. Appl. No. 14/601,623, filed Jan. 21, 2015, Jun Zhai.
International Preliminary Report on Patentability in applicatio No. PCT/US2014/048603 issued Feb. 18, 2016, 12 pages.
Office Action in ROC (Taiwan) Patent Application No. 103127346 issued Oct. 13, 2015.

* cited by examiner

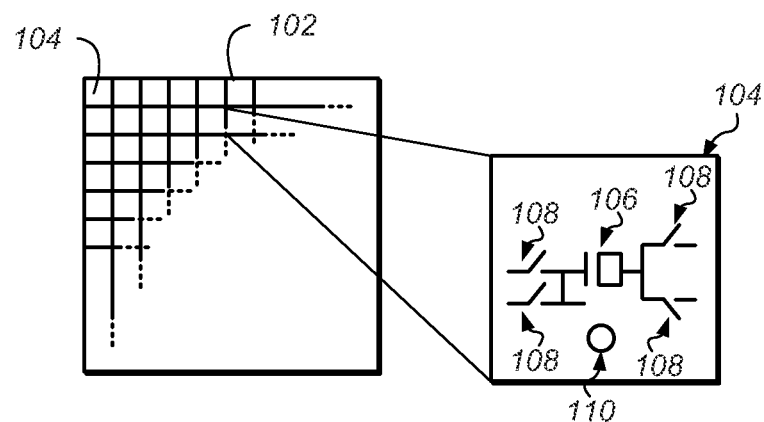
FIG. 3  FIG. 4
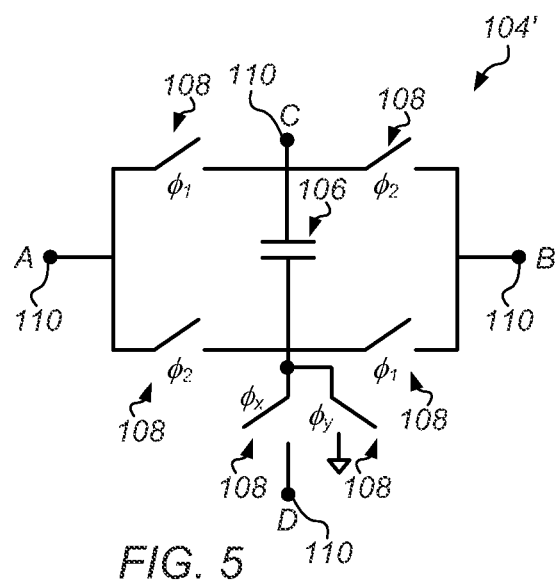 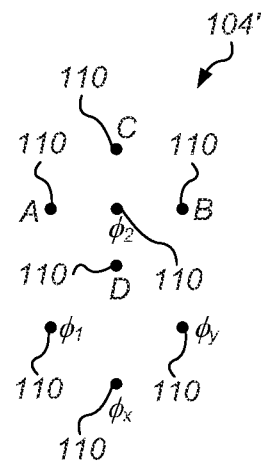
FIG. 5  FIG. 6
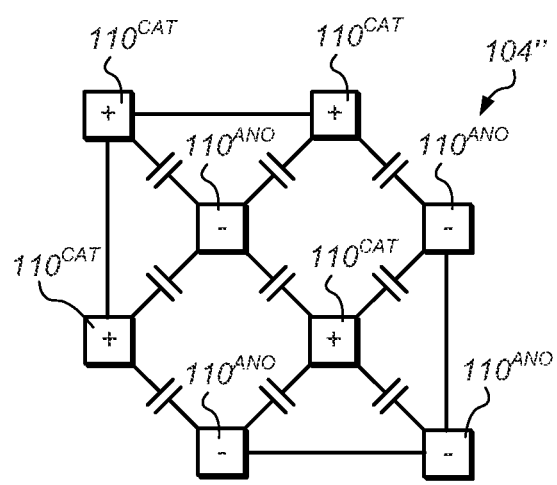
FIG. 7

MULTI-DIE FINE GRAIN INTEGRATED VOLTAGE REGULATION

PRIORITY CLAIM

This application claims benefit of priority of U.S. Provisional Application Ser. No. 61/864,014 entitled "MULTI-DIE FINE GRAIN INTEGRATED VOLTAGE REGULATION" filed Aug. 9, 2013, the content of which is incorporated by reference herein in its entirety.

BACKGROUND

1. Field of the Invention

The present invention relates to systems and methods for power supply regulation for semiconductor devices. More particularly, the invention relates to voltage regulation using passive semiconductor devices.

2. Description of Related Art

Current system on a chip (SOC) devices are being pushed towards increased integration of functionality and optimization of power/performance. Because of the increased functionality integration requirements, multiple IP blocks from multiple sources (an IP block is a reusable unit of logic, cell, or chip layout design that sometimes comes from a different single party or source) are increasingly being added to SOC devices. Each individual IP block may have its own unique power supply requirements and power delivery challenges. For example, one IP block may operate using a supply voltage that is different than other supply voltages currently available. The different supply voltage may only vary slightly from the current supply voltages (e.g., even only about 100 mV difference) but the different supply voltage may draw significant amounts of current. Because of the high current draw and the importance of energy efficiency, a simple LDO (low-dropout) linear regulator off the higher of the two supply voltages may not be a satisfactory solution for low-power designs. The combination of the drive for power efficiency and the existence of many supply voltage requirements on the SOC device may produce a fairly complex design for the connection between the SOC device and a power management unit (PMU).

The use of individual IP blocks may also provide multiple different complex analog functions in the SOC device. Some of these analog functions may benefit from operation at higher voltage supplies. Supplying the higher voltages across the device to provide the improvements in analog performance in one particular sub-portion may, however, create power inefficiencies in operation of the overall device. Thus, providing the higher supply voltages directly for analog functions such as amplifiers and current sources (e.g., supplying the higher supply voltages to the analog functions separately from other supply voltages) may allow for stacking of devices in cascode, Wilson, and/or other configurations that may improve analog performance in these critical areas.

Another issue with increasingly complex SOC devices is that there are significant resistances across the devices as the number of power consuming structures (e.g., transistors) in the device increases. To maintain the highest delivered performance for the last power consuming structure (e.g., the power consuming structure "furthest" from the PMU or the last power consuming structure experiencing the largest voltage drop), the supply voltage across the SOC device needs to be as high as possible. Raising the supply voltage, however, is constrained by the highest compliance voltage that can be tolerated by the first power consuming structure closest to the PMU. Because the supply voltage upper limit is set by the tolerance of the closest power consuming structures, the IR drop (voltage drop across the device) at the last power consuming structure becomes an uncompensated loss, which can limit performance of an SOC device. This voltage drop is becoming a more significant issue as it becomes a larger percentage of the supply voltage due to the reduction in power supply voltages. This reduction itself is driven by a desire to reduce power consumption (e.g., to reduce battery consumption and increase battery life). In addition, the reduction in performance may be exacerbated by the fact that device threshold voltage ($V_T$) is not scaling. Thus, for example, a 10% reduction in power supply voltage may result in a 20%-30% slowdown in gate speed (e.g., transistor speed), further exacerbating the effect of I*R drop on SOC performance.

Another issue with providing power supplies at lower voltages is the dramatically increased current required when selected sub-blocks of the SOC device transition into a highly active mode. During the highly active mode of the selected sub-blocks, other sub-blocks (e.g., different CPUs or GPUs) may be idle or consuming substantially lower current. These idle sub-blocks would ideally be maintained on a different power supply rail in order to sufficiently isolate power delivery and provide separate DVFS (dynamic voltage frequency scaling) settings and power-down functions. Separating the power supply rails means that there are no shared resources on SOC power delivery between the selected sub-blocks and the idle sub-blocks. Such resources could include bumps or balls on the package as well as routing and components on the printed circuit board. Placing such constraints on the SOC device may require significant design complexity in the package in order to provide an expanding group of low inductance power delivery networks.

SUMMARY

In certain embodiments, a semiconductor device package includes a power consuming device (e.g., an SOC device) and a passive device coupled to the power consuming device. The power consuming device may include one or more current consuming elements (e.g., blocks or IP blocks). The passive device may include a plurality of passive elements (e.g., capacitors) formed on a semiconductor substrate. The passive elements may be arranged in an array of structures on a semiconductor or other substrate. The power consuming device and the passive device may be coupled using one or more terminals (e.g., bumps, balls, or TSVs). In some embodiments, the semiconductor device package includes a third semiconductor device such as a memory device (e.g., a DRAM device). In some embodiments, the passive device includes the third semiconductor device or memory device.

The power consuming device may be coupled to the passive device such that the power consuming device utilizes the array of terminals for individual passive elements on the passive device in combination with the current consuming elements on the power consuming device to produce distinct (e.g., separate and localized) voltage islands by means of distinct regulators. The distinct voltage regulators may be used to provide and control power to different current consuming elements (e.g., blocks) on the power consuming device at a localized and distinct, and potentially optimized, level. Providing fine granularity localized and distinct voltage regulation to the blocks allows power optimization at a discrete block level, which results in overall reduced system power and reduces the effect of blocks with speed limiting critical paths on performance, resulting in overall power/performance improvement from conventional external coarse power delivery techniques.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which:

FIG. 3 depicts a representation of an embodiment of a passive device.

FIG. 4 depicts an enlarged view of an example of one possible embodiment of a structure.

FIG. 5 depicts a representation of an example of another possible embodiment of a structure.

FIG. 6 depicts a generic terminal footprint for the structure depicted in FIG. 5.

FIG. 7 depicts a representation of an example of an embodiment of a structure with only capacitors and terminals.

Figure 1:
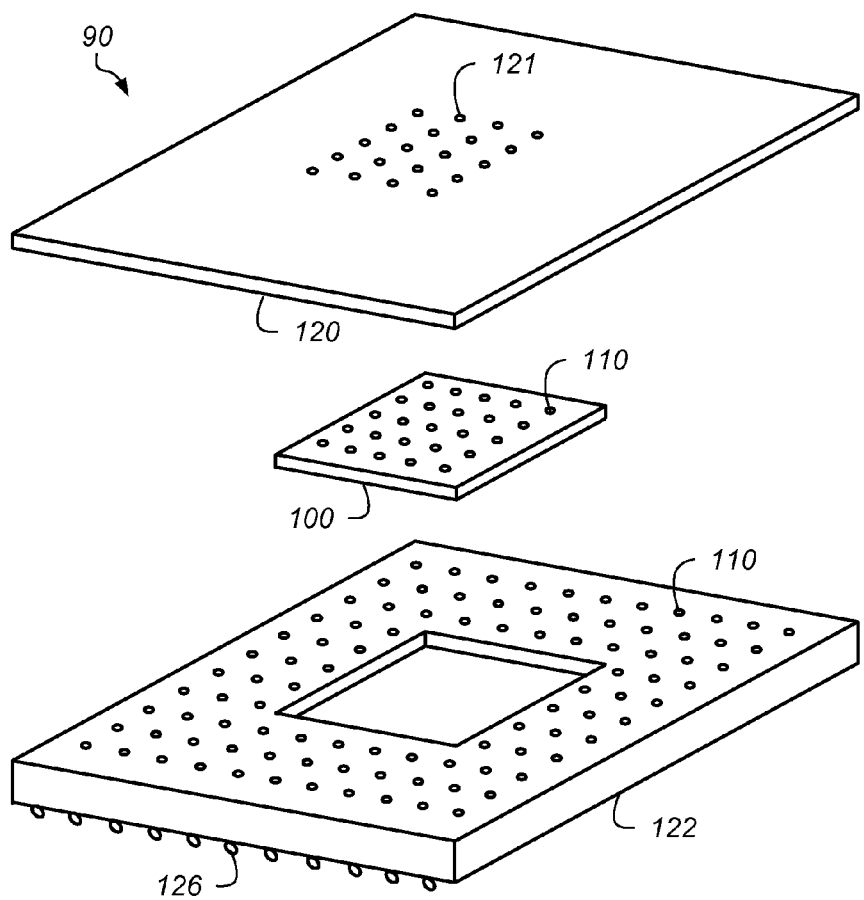
FIG. 1 depicts an exploded view representation of an embodiment of a semiconductor device package.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

A semiconductor device package may include two or more semiconductor devices coupled together. In certain embodiments, at least one of the semiconductor devices in the package is a passive semiconductor device and at least one of the semiconductor devices is a power consuming semiconductor device (e.g., a device with current consumption elements such as an SOC device). As the passive device is integrated into the package, the passive device may be termed, for example, an integrated passive device (IPD).

Figure 2:
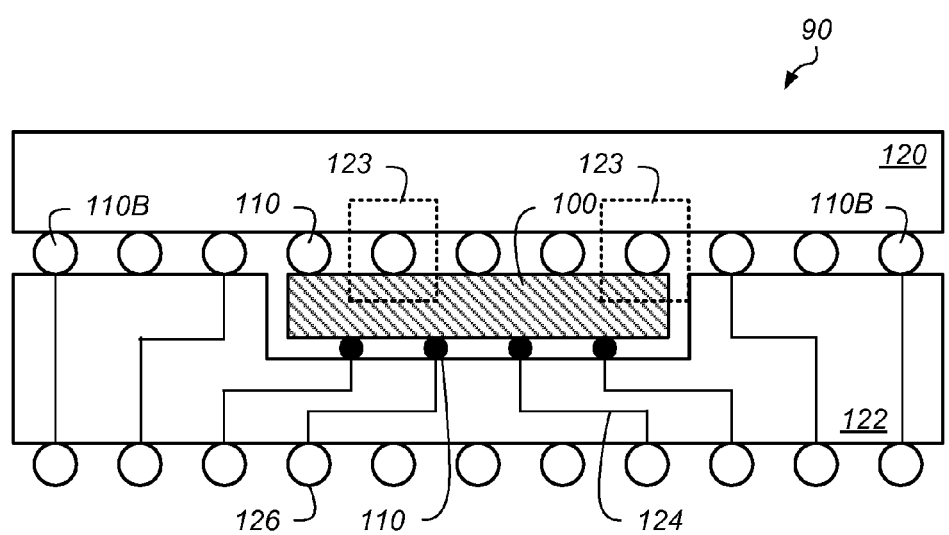
FIG. 2 depicts a side-view representation of an embodiment of a semiconductor device package.

FIG. 1 depicts an exploded view representation of an embodiment of semiconductor device package 90. FIG. 2 depicts a side-view representation of an embodiment of semiconductor device package 90. In certain embodiments, package 90 includes passive device 100, power consuming (semiconductor) device 120, and build-up package 122. In some embodiments, passive device 100, power consuming device 120, and/or build-up package 122 use similar substrates (e.g., silicon-based substrates). Using similar substrates in passive device 100, power consuming device 120, and/or build-up package 122 may provide substantially similar thermal expansion properties in each of the devices, allowing for operation across a broad temperature range without causing strain on the connections between the two devices. In certain embodiments, passive device 100 is sized to fit inside a recess in build-up package 122. Passive device 100 may be smaller than power consuming device 120 to allow area on the power consuming device not covered by the passive device to be used for general purpose I/O for the power consuming device.

In certain embodiments, passive device 100 and the power consuming device 120 are directly coupled to each other. For example, the devices may be coupled using terminals 110, as shown in FIG. 2. Terminals 110 may be terminals such as face-to-face bumps or balls, through-silicon vias (TSVs), or other three-dimensional interconnection terminals. TSVs or other vias may be formed in a build-up layer using, for example, laser drilling. In certain embodiments, certain TSVs present on passive device 100 are only used as route-throughs through the passive device to the package or a printed circuit board. Coupling the devices directly may provide short and very high density connections between elements on the passive device and regulator elements and current consumption elements 121 on power consuming device 120.

Terminals 110 may also couple power consuming device 120 and/or passive device 100 directly to build-up package 122. Terminals 110 coupled between power consuming device 120 and build-up package 122 may be used for general purpose I/O connections or for power connections not involving the integrated regulator. In some embodiments, some terminals coupling passive device 100 to build-up package 122 are route-through (e.g., three-dimensional route-through) terminals from power consuming device 120 directly to build up package 122. As shown in FIG. 2, build-up package 122 may include routing 124 to package terminals 126. Package terminals 126 may be used to couple package 90 to a printed circuit board (PCB) or other device.

Power consuming device 120 may be, for example, an SOC device. In certain embodiments, passive device 100 includes one or more passive elements (e.g., passive structures or passive devices). The passive elements may be used in combination with elements on power consuming device 120 to control and regulate voltage provided to the power consuming device.

FIG. 3 depicts a representation of an embodiment of passive device 100. In certain embodiments, passive device 100 includes array 102. Array 102 may include a substantially regular pattern (array) of structures 104 (e.g., passive structures). For example, as shown in FIG. 3, array 102 includes structures 104 arranged in a tiled pattern. Structures 104 may, however, be arranged in any substantially regular pattern to form array 102 on passive device 100. In some embodiments, structures 104 are arranged in a semiregular pattern to form array 102 on passive device 100.

In certain embodiments, structures 104 are regular structures that include one or more passive elements such as, but not limited to, capacitors (e.g., trench or other form of high-density capacitors). Structures 104 may include other elements such as switches. FIG. 4 depicts an enlarged view of an example of one possible embodiment of structure 104. As shown in FIG. 4, structure 104 may include capacitor 106 and four switches 108. Terminals 110 may be used to couple elements (e.g., capacitor 106 and/or switches 108) in structure 104 to another structure or another semiconductor device. In some embodiments, connections to terminals of array structures 104 are directly coupled to the region of power consuming device 120 directly above or below the array structure via a local face to face bump or TSV.

In some embodiments, structure 104 includes additional elements such as inductors or bipolar devices that may be provided as part of a regular pattern on passive device 100. For example, the additional elements may be provided throughout array 102 or they may be provided on only a portion of the array (such as a ring around structure 104 used for an I/O periphery ring) as such structures may be only required for certain sub-functions and may consume excessive area.

In some embodiments, array 102 includes other low-resistance couplings (e.g., power supply rails) between certain portions of array structures 104. The low-resistance couplings may be provided in passive device 100, or in an additional device or a routing layer in the semiconductor device package that may be coupled to the backside of the passive device, for example, through the dual-sided nature of TSV connections. The low-resistance couplings may be used to lower power grid resistance and improve the programmibility and/or usability of passive device 100 while minimizing impact on the routing layers of power consuming device 120. Moving power onto the low-resistance couplings may allow the power consuming device to effectively define local voltage domains between the power consuming device and passive device 100.

FIG. 5 depicts a representation of an example of another possible embodiment of array element structure 104'. FIG. 6 depicts a generic terminal footprint for structure 104' depicted in FIG. 5. As shown in FIG. 5, structure 104' may include capacitor 106 and switches 108 in a generic 6-switch configuration. Structure 104' may include eight terminals 110 (shown in FIG. 6) with four terminals used for power connections and four terminals used for gate controls. Terminals 110 may be bumps or TSVs. One or more structures 104' may be arrayed in a generic layout and the passive device using the structures may be effectively 'programmed' using the connectivity of another semiconductor device (e.g., power consuming device 120 shown in FIGS. 1 and 2) that is coupled to the passive device through terminals 110. In this manner, the same design for passive device 100, shown in FIG. 3, can be used for different functions with different power consuming devices 120.

In certain embodiments, the number of switches (or other active elements) in passive device 100, shown in FIG. 3, is minimized. For example, passive device 100 may include only capacitors (e.g., passive elements) or the passive device may include capacitors and only a few switches or power supply rails. The capacitors and few switches may be coupled together within structure 104 in array 102 to increase the granularity of the array until the array granularity best matches the granularity of terminals (TSVs, bumps, or other connections) used to couple to passive device 100.

FIG. 7 depicts a representation of another example of an embodiment of passive device structure 104" with only capacitors 106 and terminals 110. In certain embodiments, structure 104" (and array 102) may be laid out (e.g., designed) with a maximum distance of separation between positive terminals $110^{CAT}$ and negative terminals $110^{ANO}$. Separating positive terminals $110^{CAT}$ and negative terminals $110^{ANO}$ with the maximum distance possible for a given power connection density may minimize the potential for shorting between capacitors 106. In some embodiments, separating positive terminals $110^{CAT}$ and negative terminals $110^{ANO}$ substantially inhibits shorting between capacitors 106. Misalignment between terminals may result in a structure with an open failure (e.g., a "soft" failure) for a particular cell in the array or a short between two cells in the array. The open failure, however, may only result in a small reduction in capacitance that may be compensated for in a closed-loop regulator whereas a short failure (caused by too little distance between the terminals) may result in yield loss of passive device 100.

Figure 8:
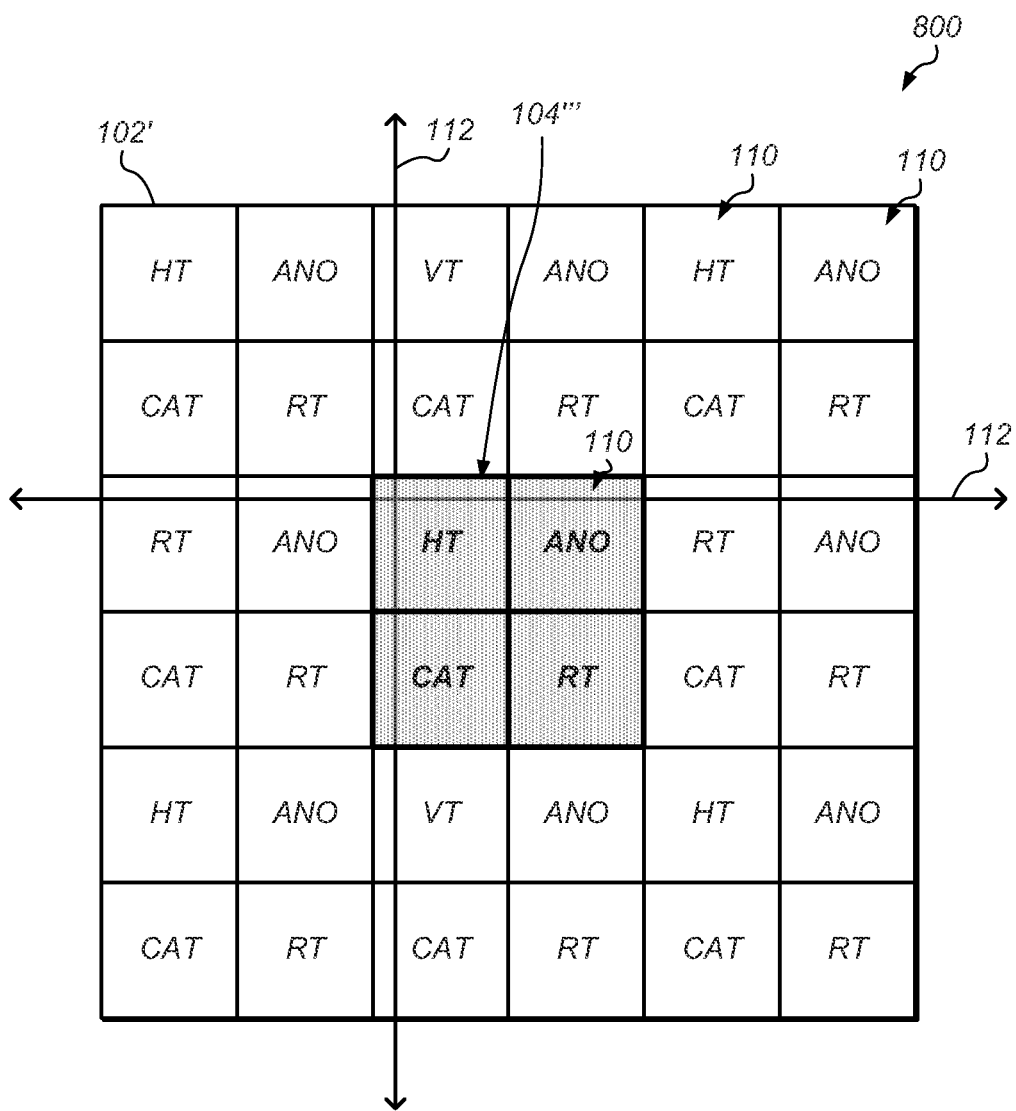
FIG. 8 depicts a representation of an embodiment of a terminal footprint for an array using structures.

FIG. 8 depicts a representation of an embodiment of terminal footprint 800 for an array using structures similar to structure 104" (shown in FIG. 7). Array 102', as shown in FIG. 8, includes 9 (nine) structures 104''', which include 2×2 grids of terminals 110. Terminals 110 may be, for example, TSVs or bumps. Each structure 104''' includes terminals for cathodes ("CAT") and anodes ("ANO") of capacitors in the structure in addition to either terminals for route-through ("RT") resources (e.g., three-dimensional routed resources), horizontal track ("HT"), or vertical track ("VT").

CAT and ANO terminals may be placed at opposite corners of each structure 104''' to reduce the likelihood of shorting between the terminals. RT terminals, HT terminals, and VT terminals may be alternated between structures 104''' in array 102' in both the x- and y-directions. HT terminals and VT terminals may be provided for connection to horizontal tracks and/or vertical tracks, which may be used as power rails. The horizontal and vertical tracks may include, for example, metal routing (rails) 112 within passive device 100 that provide an ability to connect power to one or more structures. HT terminals and VT terminals may be provided in fewer structures as low-resistance horizontal tracks and vertical tracks are typically less frequently required than capacitor connections. Non-shaded structures 104''' in array 102' (e.g., structures outside the center shaded structure) may be overlapped areas of the array when the array is stepped in either the x- or y-direction (e.g., areas may overlap when array 102' is used as a base array to produce a larger array).

Using a structure without switches (such as structure 104" or structure 104''') in passive device 100 may allow switching elements or other active elements to primarily (or completely) be located on a power consuming device (e.g., power consuming device 120 shown in FIGS. 1 and 2) coupled to the passive device in a semiconductor device package (e.g., package 90). Thus, processing technology for forming passive device 100 may be focused on producing better capacitors (e.g., producing capacitors as close to ideal capacitors as possible) and/or other passive elements such as inductors or low-resistance power supply rails. Focusing the processing technology on producing passive devices instead of producing these devices in combination with other active elements (such as components of the voltage regulator) may provide improved reliability and operation for the capacitors in package 90. For example, the capacitors may have less equivalent series resistance (ESR) and/or have less parasitic capacitance to ground from their anode or cathode terminals. In addition, the switches are primarily moved to power consuming device 120, which typically has good technology for producing switches. In some embodiments, passive device 100 may also contain switches or other components that are developed using a significantly different process than power consuming device 120. For example, a Gallium Nitride (GaN) process may be used in order to support higher conductance and tolerate higher voltages. Such process optimization for passive device 100 can be made independently of the optimization of process for power consuming device 120.

Power consuming device 120 may include elements of a typical regular SOC device. In certain embodiments, power consuming device 120 is coupled to passive device 100, as shown in FIGS. 1 and 2, such that the power consuming device utilizes the grid (e.g., array) of terminals for elements (e.g., capacitors) on the passive device to produce distinct (e.g., separate and localized) voltage regulators (e.g., distinct voltage regulators represented by dashed lines 123 in FIG. 2) with fine granularity between the regulators. The distinct voltage regulators may be provided a higher input voltage than groups of structures or elements (e.g., blocks such as IP blocks) on power consuming device 120 may require and/or may tolerate directly. The distinct voltage regulators may operate at the higher input voltage because separating and localizing the voltage regulators allows each voltage regulator to provide a desired input voltage directly to its corresponding block (e.g., selected block) without using package connection resources.

In embodiments that use face-to-face bumps or balls as terminals (e.g., TSVs are not used through passive device 100), high input voltages may need to be provided to power consuming device 120 without going through the passive device (e.g., the terminals for the high input voltages must be located outside the area covered by the passive device). For example, for the embodiment shown in FIG. 2, terminals 110 directly connecting passive device 100 and power consuming device 120 may be face-to-face bumps or balls and thus, terminals outside the edges of the passive device (e.g., terminals 110B) may be used as the terminals for the high input voltages. These high input voltages, however, may be provided at lower currents than packages without passive device 100 because the distinct voltage regulators built with a combination of elements from passive device 100 and power consuming device 120 allow localized reduction of the voltage to levels compliant for blocks on power consuming device 120. As power=voltage*current, providing higher input voltages (e.g., 3-8 times higher than the voltages used for blocks on power consuming device 120) allows for less current to be provided to achieve the same power levels in the power consuming device and fewer terminals (e.g., bumps or balls) may thus be used to provide power and ground to the package.

The distinct voltage regulators may be designed as different types of voltage regulators including, but not limited to, single or multi-level switched-cap converters, buck converters, or hybrid converters (e.g., a combination of both buck and switched-cap converters). Hybrid or Buck converters may require the use of inductors on either passive device 100 or power consuming device 120.

Power consuming device 120 utilizes the array (e.g., array 102') on passive device 100 to produce distinct, localized voltage regulators by mapping the array (and the array's subset of structures such as structures 104" or structures 104'") into the properties needed to produce the voltage regulators for the power consuming device. The array may be mapped by using logic, connectivity, or any structures on power consuming device 120 to 'program' or determine the connectivity between structures or elements on passive device 100 and blocks on the power consuming device. Thus, power consuming device 120 may determine what properties are needed in each voltage regulator (e.g., regions covered and connected, voltage division ratios, operating frequency, feedback point, enable controls, etc.) according to the needs of the corresponding block on the power consuming device.

In certain embodiments, structures on passive device 100 used in combination with a selected block on power consuming device 120 are localized in an area at or near the selected block. For example, the structures on passive device 100 used in combination with the selected block may be just below or just above the selected block if the passive device is vertically stacked relative to power consuming device 120. Localizing the structures on passive device 100 used in combination with the selected block on power consuming device 120 reduces (or minimizes) the distance between the voltage regulator and the selected block being providing power by the voltage regulator. Reducing the distance between the voltage regulator and the selected block and reducing the connected impedance (which, in the case of 3D connectivity, is largely defined by the array of terminals over the selected block) may reduce or minimize the voltage I*R drop experienced by the selected block and improve power efficiency of distribution to the selected block. Reducing the distance may also reduce the voltage drop by providing very fast and local feedback of the supplied voltage into the voltage regulation loop (e.g., a highly localized feedback response, which minimizes voltage margin requirements and reduces feedback time), providing lower resistance using TSV or bump connectivity, and providing a shorter distance for the higher current, lower voltage path (e.g., little to no board trace). In addition, reducing the voltage I*R drop to the selected block may allow the device's maximum operating frequency to be increased or the minimum operating voltage to be reduced. The operating frequency or operating voltage for selected blocks may be increased using active feedback controls to reduce aging effects in power consuming device 120.

In certain embodiments, separating and localizing the distinct voltage regulators allows input voltage for the selected block to be reduced to a minimum operating point for a desired operating frequency. Thus, separate DVFS (dynamic voltage & frequency scaling) settings and power-down functions may be provided to an individual block without affecting other blocks in power consuming device 120. In such cases, level converters may be required for connections between blocks operating in different DVFS voltage domains. In addition, using distinct voltage regulators allows a relatively high power block to utilize a different power supply voltage from a block that has a speed limiting critical path and may be furthest from the PMU). Without distinct voltage regulators, the high power block and the block with the speed limiting critical path may have to share a power supply and thus the voltage provided to the high power block has to be maintained at a minimum level to maintain performance in the block with the speed limiting critical path, thus wasting power in the high-power block, which may not contain the same critical path. Separating voltage regulation of the high power block from voltage regulation of the block with the speed limiting critical path allows the power provided the high power block to be optimized to its own critical path (e.g., by reducing the voltage) without affecting the performance of the block with the speed limiting critical path. Depending on modes of operation or other conditions, different blocks can have vastly differing critical paths and power consumption, making sharing of power supplies between such blocks a poor idea for optimum power consumption.

In some embodiments, sub-portions of blocks in power consuming device 120 (e.g., a separate function such as an ALU or MPY within a CPU or FPU) are able to operate off their own voltage regulators. For example, power consuming device 120 may define voltage regulators using passive device 100 that are localized and distinct for sub-portions of the blocks in the power consuming device. Separating and localizing voltage regulation for the sub-portions allows optimization of voltage for each function controlled by the different sub-portions. Thus, power consumption at the desired operating frequency may be minimized even further. Such critical path optimization of voltage (e.g., optimization based on sub-portion function) may be done, for example, using matching paths, lookup tables, early/late redundant flops as detectors on paths, or other similar methods.

In some embodiments, one or more of the distinct voltage regulators or certain sub-components of the regulators act as a power-gating devices to inhibit low-power leakage and essentially replace existing power-gating devices used to reduce leakage on power consuming devices. For example, when a selected block on power consuming device 120 is powered down, one or more switches in the distinct voltage regulator (e.g., a switched-cap implementation of the voltage regulator) may be shutoff. Shutting off the switches may reduce leakage in an active block without the need for additional power-gating devices, which are currently included in power consuming device 120.

In some embodiments, adjacent distinct voltage regulators are able to share resources on passive device 100 according to needs of blocks on power consuming device 120. For example, certain functions on power consuming device 120 are known to not operate simultaneously. In such embodiments, portions of structures or elements on passive device 100 (e.g., capacitors or tiles on the passive device) may be alternatively allocated to one distinct voltage regulator or another by continuing the row or column connections to include the shared devices via, for example, switches to a common rail within the row or column.

In certain embodiments, passive device 100 includes a regular array of structures that is generic (e.g., the passive device may be used with two or more different designs of power consuming structures). Properties of the distinct voltage regulators created using the generic passive device may be controlled by the power consuming device coupled to the generic passive device. For example, granularity choices (e.g., localization patterns), control, and drive circuitry for the voltage regulators may be placed on the power consuming device. Thus, the generic passive device may be used with several different power consuming devices or across several different generations of similar power consuming devices without modifying the design of the generic passive device. For example, footprint 800, shown in FIG. 8, may be used to generate a generic passive device that is used with many different power consuming devices (even power consuming devices from different manufacturers) and/or the generic passive device may be manufactured by different manufacturers to the same generic specifications or "footprints" of the generic passive device connections. Providing a generic passive device design allows the design and/or manufacturing of the generic passive device to be optimized and costs for producing the generic passive device to be reduced as the generic passive device may be produced as a commodity useable across several platforms and/or generations of devices.

Figure 9:
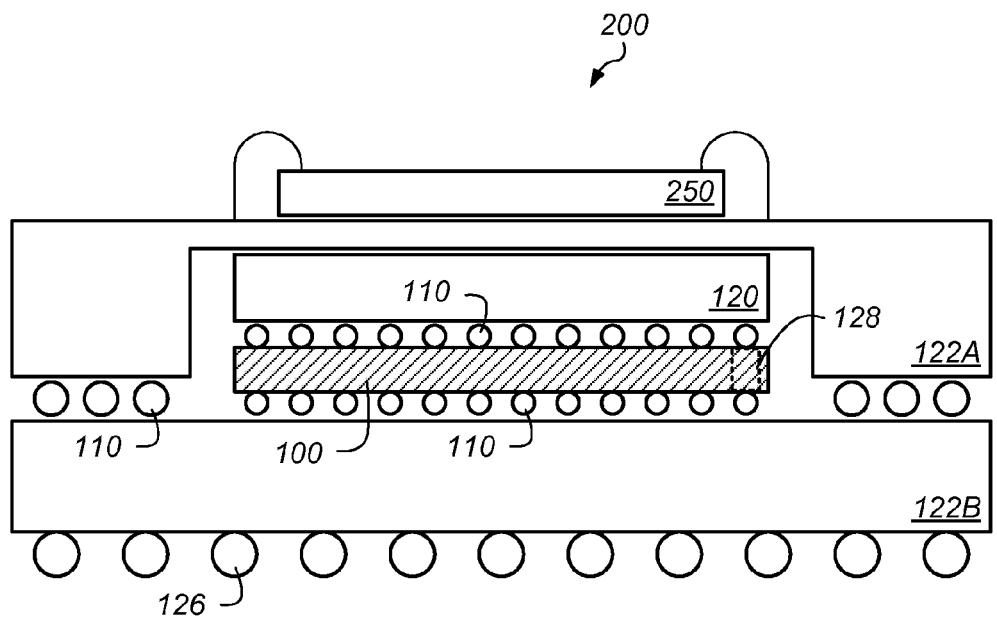
FIG. 9 depicts a side-view representation of an embodiment of a package with a passive device, a power consuming device, and a memory device.

In some embodiments, a semiconductor device package includes one or more additional devices in addition to passive device 100 and power consuming device 120. For example, the semiconductor device package may include a memory device (e.g., a DRAM device such as a high-speed or low-power DRAM core) in addition to passive device 100 and power consuming device 120. FIG. 9 depicts a side-view representation of an embodiment of package 200 with passive device 100, power consuming device 120, and memory device 250. Package 200 may include top build-up package 122A and bottom build-up package 122B.

Memory device 250 may be coupled to top package 122A while passive device 100 and power consuming device 120 are coupled together and sandwiched between the top package and bottom package 122B. In certain embodiments, passive device 100 and power consuming device 120 lie in a recess in top package 122A. As shown in FIG. 9, passive device 100 and power consuming device 120 may be approximately the same size. Thus, passive device 100 may include route-through terminals 128 (e.g., TSVs) to provide general I/O connections between bottom package 122B and power consuming device 120. In some embodiments, passive device 100 is smaller than power consuming device 120 and connections are provided to power consuming device outside the area overlapped by passive device 100 as described earlier.

Figure 10:
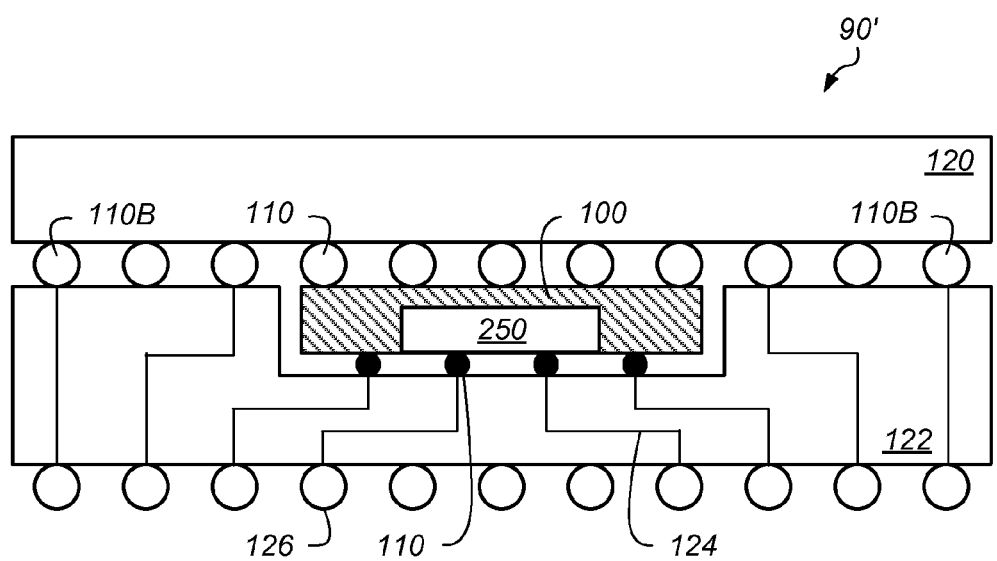
FIG. 10 depicts a side-view representation of another embodiment of a semiconductor device package.
Figure 11:
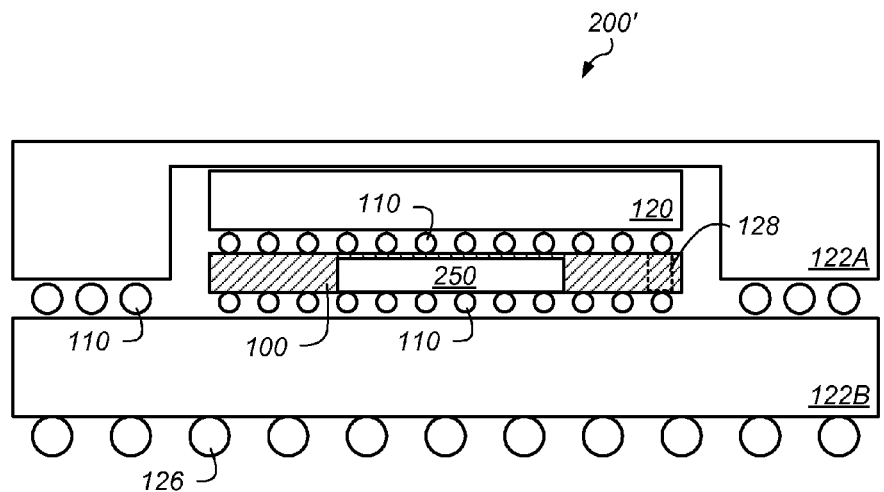
FIG. 11 depicts a side-view representation of yet another embodiment of a semiconductor device package.

In some embodiments, passive device 100 includes one or more other structures in the passive device in addition to the array of passive devices. For example, passive device 100 may include structures such as memory device 250 or other structures. FIG. 10 depicts a side-view representation of an embodiment of package 90' with memory device 250 integrated in passive device 100. FIG. 11 depicts a side-view representation of an embodiment of package 200' with memory device 250 integrated in passive device 100. The passive elements (e.g., capacitors) may be made during a process used to form memory device 250. In some embodiments, the process for forming memory device 250 is slightly modified to include forming the passive elements.

Because passive device 100 is located relatively close to power consuming device 120, as shown in FIGS. 10 and 11, the passive device has a high degree of connectivity with the power consuming device. Thus, passive device 100 may provide high-bandwidth, low power connections for other structures in the passive device (e.g., memory device 250) using face-to-face bump connections or other packaging connections discussed herein. Because the embodiments of package 90' and package 200', shown in FIGS. 10 and 11, have memory device 250 inside passive device 100, such embodiments may supply both high-bandwidth, low power memory connections between the memory device and power consuming device 120 and passive devices for supply filtering or power regulation when the passive devices are combined into various different regulator structures described herein (e.g., the distinct voltage regulators).

In some embodiments, the regulator structures are fully contained within passive device 100. In other embodiments, portions of the regulator structures are located on power consuming device 120. In certain embodiments, as shown in FIG. 10, passive device 100 (and memory device 250) are smaller than power consuming device 120. In some embodiments, passive device 100 is substantially smaller than power consuming device 120. When passive device 100 is smaller than power consuming device 120, a portion of the bump area of the power consuming device is available for I/O or other power delivery connections. In some embodiments, as shown in FIG. 11, passive device 100 (with memory device 250) is substantially similar in size to power consuming device 120.

Figure 12:
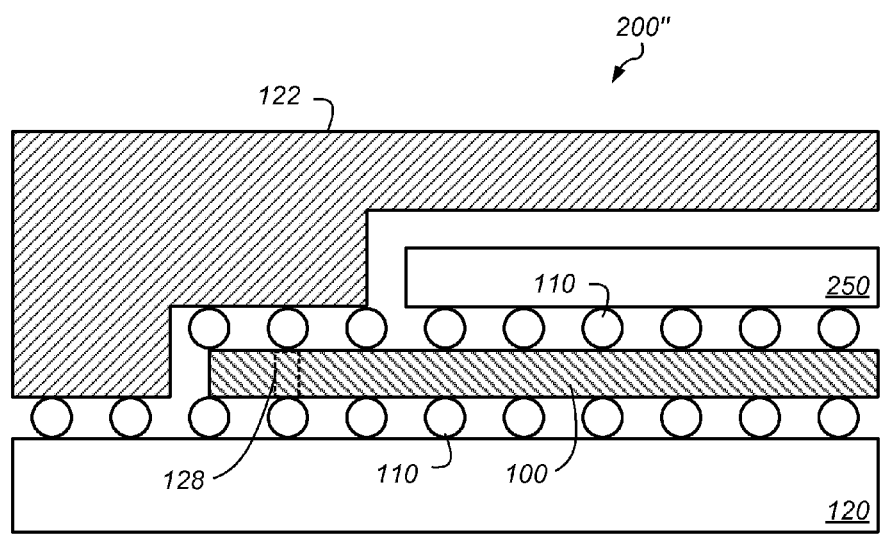
FIG. 12 depicts a side-view representation of another embodiment of a package with a passive device, a power consuming device, and a memory device.

FIG. 12 depicts a side-view representation of an embodiment of package 200" with passive device 100 containing TSVs 128, power consuming device 120, and memory device 250. Package 200" may include passive device 100 and memory device 250 sandwiched between build-up package 122 and power consuming device 120. Passive device 100 may include route-through terminals to provide connections between power consuming device 120 and memory device 250. In some embodiments, passive device 100 is offset from power consuming device 120 to allow direct general I/O connections between the power consuming device and build-up package 122. In some embodiments, build-up package 122 may include routing for connection between power consuming device 120 and memory device 250 without going through passive device 100. In some embodiments, TSVs are built into passive device 100, or, alternately, power consuming device 120, or both devices. In some embodiments, the functions of memory device 250 and passive device 100 are combined to be on a single die. This may be particularly useful if the memory device is a DRAM which contains a high-density capacitor array as part of its fundamental process. Other combinations of die function are possible and will be apparent to those skilled in the art.

In some embodiments, standard package techniques such as use of build-up material, staggering, and face-to-face connectivity can be combined with system requirements and applied by those skilled in the art to eliminate TSVs from the different devices in the system and thereby reduce cost.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device, comprising:
    a semiconductor substrate;
    a plurality of passive structures formed into an array on a surface of the semiconductor substrate, wherein the passive structures comprise one or more passive elements formed on the semiconductor substrate, at least one of the passive elements being a capacitor, and wherein the array comprises a regular array in x- and y-directions on the surface of the semiconductor substrate, the regular array in x- and y-directions comprising at least two capacitors arrayed in the x-direction and at least two capacitors arrayed in the y-direction; and
    a plurality of terminals on the surface of the semiconductor substrate for coupling the array of passive structures to at least one additional semiconductor device;
    wherein the array comprises a tiled pattern of the passive structures, and wherein each tile includes at least two of the plurality of terminals on the surface of the semiconductor substrate distinctly associated with the passive elements in the tile, and wherein a first terminal distinctly associated with the passive elements in the tile comprises an anode for the passive elements in the tile and a second terminal distinctly associated with the passive elements in the tile comprises a cathode for the passive elements.

2. The device of claim 1, wherein two or more of the passive structures in the array are coupled together.

3. The device of claim 1, wherein at least one of the plurality of terminals comprises a through-silicon via (TSV).

4. The device of claim 1, wherein the plurality of terminals allows coupling the passive structures to at least two additional semiconductor devices.

5. The device of claim 1, wherein at least some of the plurality of terminals are configured to be coupled to an additional semiconductor substrate comprising a build-up package.

6. The device of claim 1, wherein the anode and the cathode are positioned at opposite corners of the tile.

7. The device of claim 1, wherein each tile includes at least one additional terminal distinctly associated with the passive elements in the tile, at least one additional terminal in at least one tile comprising a connection to a power rail.

8. The device of claim 1, wherein each tile includes at least one additional terminal distinctly associated with the passive elements in the tile, at least one additional terminal in at least one tile comprising a route-through connection through the semiconductor substrate.

9. A semiconductor device package, comprising:
    a first semiconductor device comprising:
        a first semiconductor substrate;
        one or more passive elements formed on the first semiconductor substrate, at least one of the passive elements being a capacitor;
        one or more first terminals on a first side of the first semiconductor substrate; and
        one or more second terminals on a second side of the first semiconductor substrate;
    a second semiconductor device directly coupled to the first semiconductor device using one or more of the first terminals, the second semiconductor device comprising:
        a second semiconductor substrate; and
        one or more current consuming elements formed on the second semiconductor substrate; and
    a third semiconductor substrate coupled to the first semiconductor device and the second semiconductor device, wherein the third semiconductor substrate is directly coupled to the first semiconductor device using one or more of the second terminals, and wherein the third semiconductor substrate is directly coupled to the second semiconductor device using one or more third terminals.

10. The device of claim 9, wherein the passive elements are arranged in an array on the first semiconductor substrate.

11. The device of claim 9, wherein the second semiconductor device comprises a system on a chip (SOC) device.

12. The device of claim 9, wherein two or more of the passive elements are coupled together.

13. The device of claim 9, further comprising one or more switches formed on the second semiconductor substrate.

14. The device of claim 9, further comprising coupling a memory device to the first semiconductor device using one or more of the first or second terminals.

15. The device of claim 9, further comprising a memory device formed on the first semiconductor substrate.

16. The device of claim 9, wherein the first semiconductor device comprises metal routing on the first semiconductor substrate coupled to one or more of the passive elements, and wherein the metal routing comprises a power rail for the passive elements and the current consuming elements.

17. The device of claim 9, wherein the third semiconductor substrate comprises a build-up package and the third terminals comprise terminals positioned between the build-up package and the second semiconductor substrate.

18. The device of claim 9, wherein the third terminals comprise route-through terminals through the first semiconductor substrate.

19. The device of claim 9, wherein a set of first terminals directly couples a block of passive elements on the first semiconductor substrate with a block of current consuming elements on the second semiconductor substrate that directly face the block of passive elements.

20. The device of claim 19, wherein the direct coupling between the block of passive elements and the block of current consuming elements forms a localized voltage regulator.

21. The device of claim 20, wherein the second semiconductor device defines one or more properties of the localized voltage regulator.

* * * * *